US009659695B2

(12) United States Patent
Inoue et al.

(10) Patent No.: US 9,659,695 B2
(45) Date of Patent: May 23, 2017

(54) DIPOLE RING MAGNETIC FIELD GENERATOR

(71) Applicant: SHIN-ETSU CHEMICAL CO., LTD., Chiyoda-ku, Tokyo (JP)

(72) Inventors: Takanobu Inoue, Echizen (JP); Dai Higuchi, Tokyo (JP)

(73) Assignee: SHIN-ETSU CHEMICAL CO., LTD, Tokyo (JP)

( * ) Notice: Subject to any disclaimer, the term of this patent is extended or adjusted under 35 U.S.C. 154(b) by 0 days.

(21) Appl. No.: 15/216,900

(22) Filed: Jul. 22, 2016

(65) Prior Publication Data

US 2017/0032877 A1    Feb. 2, 2017

(30) Foreign Application Priority Data

Jul. 31, 2015   (JP) ................... 2015-152004

(51) Int. Cl.
  *H01F 7/02*   (2006.01)
  *G01R 33/383*  (2006.01)

(52) U.S. Cl.
  CPC ........... *H01F 7/021* (2013.01); *G01R 33/383* (2013.01); *H01F 7/0221* (2013.01);
  (Continued)

(58) Field of Classification Search
  CPC .... H01F 7/0268; H01F 7/0273; H01F 7/0278; G01R 33/383
  (Continued)

(56) References Cited

U.S. PATENT DOCUMENTS

| 4,538,130 A | * | 8/1985 | Gluckstern | .......... | G01R 33/383 |
| | | | | | 250/396 ML |
| 4,758,813 A | * | 7/1988 | Holsinger | ............ | G01R 33/383 |
| | | | | | 29/599 |

(Continued)

FOREIGN PATENT DOCUMENTS

| EP | 0 661 728 A1 | 7/1995 |
| JP | 63009102 | 1/1988 |

(Continued)

OTHER PUBLICATIONS

European Search Report corresponding to application No. EP 04018294.1, dated Sep. 23, 2005.
European Patent Office, European Search Report, Dec. 7, 2016.

*Primary Examiner* — Ramon M Barrera
(74) *Attorney, Agent, or Firm* — Williams Mullen, P.C.; F. Michael Sajovec

(57) ABSTRACT

Provided is a dipole ring magnetic field generator capable of generating a substantially unidirectional magnetic field in the internal space of a ring without using permanent magnet pieces having fan-shaped or trapezoidal sections, and as a result, a smaller skew angle therein is achieved. The sections of the permanent magnet pieces are shaped to be rectangular, and a plurality of the rectangular permanent magnet pieces are circularly placed at predetermined positions. Each of first, second, third and fourth permanent magnet units, which are main permanent magnet units, comprises five or more permanent magnet pieces. The first and third permanent magnet units, as well as the second and fourth permanent magnet units, are positioned oppositely from each other with respect to a central axis of the magnetic field generator and have hollow shapes or E-shapes facing against each other in a section perpendicular to the central axis.

14 Claims, 4 Drawing Sheets

(52) U.S. Cl.
CPC ......... *H01F 7/0268* (2013.01); *H01F 7/0273* (2013.01); *H01F 7/0278* (2013.01)

(58) Field of Classification Search
USPC ........................................... 335/306
See application file for complete search history.

(56) References Cited

U.S. PATENT DOCUMENTS

| | | | |
|---|---|---|---|
| 4,810,986 A | | 3/1989 | Leupold |
| 4,829,277 A | | 5/1989 | Stahura |
| 5,055,812 A | | 10/1991 | Abele et al. |
| 5,659,250 A | * | 8/1997 | Domigan .............. H01F 7/0278 324/319 |
| 2004/0104794 A1 | | 6/2004 | Kohda et al. |
| 2005/0030138 A1 | | 2/2005 | Higuchi |

FOREIGN PATENT DOCUMENTS

| | | |
|---|---|---|
| JP | 04022337 | 1/1992 |
| JP | 05291026 | 5/1993 |
| JP | 1041284 | 2/1998 |
| JP | 10041284 | 2/1998 |
| WO | 02780180 | 10/2002 |

\* cited by examiner

__US 9,659,695 B2__

DIPOLE RING MAGNETIC FIELD GENERATOR

BACKGROUND OF THE INVENTION

1. Field of the Invention

The present invention relates to a dipole ring magnetic field generator.

2. Description of the Related Art

A typical dipole ring magnetic field generator comprises a plurality of permanent magnet pieces arranged in such a ring that the magnetization direction of each permanent magnet piece makes one rotation over a half circumference of the ring so as to generate a substantially unidirectional magnetic field in the internal space, wherein each permanent magnet piece has a magnetic field of the same intensity as that of the unidirectional magnetic field. Such a dipole ring magnetic field generator is used in an extensive range of applications, including a magnetic resonance imager (MRI), a semiconductor device manufacturing process, and a uniform magnetic field generator for basic researches (e.g. JP 2005-56903A). Conventionally, normal conductive electromagnets, superconductive electromagnets and the like have been used as the means for generating a uniaxial uniform magnetic field. However, the recent development of high-performance rare earth permanent magnets is causing the rare earth permanent magnets (hereinafter may be referred to simply as "the permanent magnets" or "magnets") to be used dominantly as a uniform magnetic field generator in the application of a low magnetic field of, for example, 1T or less.

A conventional dipole ring magnetic field generator, the permanent magnet pieces comprised by the generator and others will be explained with reference to FIG. 4. FIG. 4 exhibits a schematic sectional view in a plane perpendicular to the central axis of a conventional dipole ring magnetic field generator 6. The dipole ring magnetic field generator 6 comprises a plurality of permanent magnet pieces 701 to 724 and an outer rim yoke 8 surrounding the permanent magnet pieces. As the permanent magnet pieces 701 to 724 in FIG. 4, for example, Nd—Fe—B base, Sm—Co base, or Sm—N—Fe base rare earth permanent magnets, each having an approximately trapezoidal shape or fan-like shape, are used. Further, as the outer rim yoke 8, an annular ferromagnetic or nonmagnetic material is used. The division number of the magnets comprised by the magnetic field generator, i.e. the number of the permanent magnet pieces, may range from about four to about sixty. The number of the magnet pieces is typically selected to be in the range of about twelve to about thirty-six in consideration of high magnetic efficiency and easy circuit fabrication. FIG. 4 exhibits an embodiment of twenty-four divisions.

The permanent magnet pieces 701 to 724 are individually magnetized at a specific cycle with respect to a radial direction. The permanent magnet pieces exactly opposing each other from the central axis of the ring comprised by the magnetic field generator 6 are magnetized with an angle difference of 360 degrees from each other. Adjacent permanent magnets are typically magnetized with angle differences indicated by equations (1) and (2).

$$\theta n = -\frac{360}{N} * n \quad (n = 1, 2, \ldots, N/2) \tag{1}$$

$$\theta n = 360\left(\frac{n}{N} - 1\right) \quad (n = N/2 + 1, N/2 + 2, \ldots, N) \tag{2}$$

wherein "θn" represents magnetization direction of n-th magnet, "N" represents division number (natural number) of magnetic circuit, and "n" represents segment number (natural number).

A substantially unidirectional magnetic field, such as the magnetic field having the direction of main magnetic field component (A) in FIG. 4, is generated in the internal space of the ring of the dipole ring magnetic field generator 6 as a result of the magnets configuration described above. If the direction of main magnetic field component (A), which is an X-axis direction in FIG. 4 and which is generated in the internal space of the ring of the dipole ring magnetic field generator 6, is defined as zero degrees, then the angle of a magnetic field vector at any given point of the internal space (hereinafter may be referred to as "skew angle") is almost zero degrees at the center of the internal space, while the angle of the magnetic field vector tends to deteriorate, i.e. increase, toward the inner wall of the magnetic field generator, due to the characteristics of the magnetic field generator.

When a typical dipole ring magnetic field generator is used, a magnetic field component having a large skew angle is frequently regarded as an impurity, i.e. a noise. Especially a skew angle component (B) on the plane perpendicular to the central axis of the magnetic field generator in FIG. 4 is considered to significantly affect the performance of an element to be produced in the manufacturing process of, for example, semiconductor substrates or the like. For this reason, the skew angle component (B) is required to be controlled to a minimum.

SUMMARY OF THE INVENTION

It is usually considered that an adequate intensity and improved uniformity of a magnetic field to be generated and a reduced skew angle cannot be obtained unless the permanent magnet pieces comprised by the dipole ring magnetic field generator are of fan-like shapes or trapezoidal shapes approximating the fan-like shapes in the sections thereof on the plane perpendicular to the central axis of the magnetic field generator as shown in FIG. 4. On the other hand, permanent magnets, such as rare earth permanent magnets, are produced by a powder metallurgy process, so that the permanent magnets are desirably produced in rectangular shapes in their sections, such as a rectangular parallelepiped (columnar shape) as a whole in order to improve efficiency. Permanent magnets having variant sectional shapes, such as the fan-like shapes or the trapezoidal shapes, lead to a lower product yield, contributing to higher cost.

The magnetization direction of anisotropic magnets, such as the rare earth permanent magnets, is determined by the formation in a magnetic field during the manufacturing process. For example, an Nd—Fe—B base magnet has significantly different shrinkage ratios between a magnetization direction and a non-magnetization direction, so that a magnetization direction of a magnet having a rectangular parallelepiped shape is mostly selected to be parallel to a particular side. More specifically, if a magnet is formed such that the magnet is magnetized along one side of the rectangular shape of the section thereof, then the deformation of the magnet after sintering can be controlled to be a minimum.

For example, regarding a magnetic field generator for which the uniformity of the magnetic field in the internal space is not very important but the high directivity of the magnetic field, i.e. a low skew angle, is of major concern, the magnetic circuit of the apparatus is desirably configured in a simple manner and at low cost by using only magnets having rectangular sections rather than by using the trapezoidal magnets comprising pieces of variant shapes, such as trapezoids in the conventional dipole ring magnetic field generator.

Accordingly, an object of the present invention is to provide a dipole ring magnetic field generator comprising permanent magnet pieces with simplified sectional shapes of rectangles and being capable of generating a substantially unidirectional magnetic field in the internal space of a ring, without using conventional permanent magnet pieces having fan-shaped or trapezoidal sections that contribute to high cost. Another object of the invention is to achieve a reduced skew angle of the magnetic field generator.

The present inventors have earnestly studied to solve the problem described above, and discovered that a reduced skew angle of a dipole ring magnetic field generator can be achieved by adopting a rectangular sectional shape for the permanent magnet pieces comprised by the dipole ring magnetic field generator and by arranging the permanent magnet pieces having the rectangular sections at predetermined positions, thus completing the present invention.

The present invention relates to a dipole ring magnetic field generator comprising:

a cylindrical yoke in which at least four magnet insertion holes are circularly provided in a circumferential direction between an inner circumference and an outer circumference of the cylindrical yoke, each direction of depth of the magnet insertion holes being parallel to a central axis of the cylindrical yoke; and at least four permanent magnet units inserted in the at least four magnet insertion holes, the dipole ring magnetic field generator being adapted to generate a substantially unidirectional magnetic field in a radial direction of the cylindrical yoke in an internal space of the cylindrical yoke, wherein, in the case where the central axis is defined as a Z-axis, an axis perpendicular to the Z-axis and parallel to the unidirectional magnetic field in a section perpendicular to the central axis is defined as an X-axis, and an axis perpendicular to the Z-axis and the X-axis is defined as a Y-axis, the at least four permanent magnet units are arranged such that shapes thereof in the section are line-symmetric with respect to the X-axis as an axis of symmetry and line-symmetric with respect to the Y-axis as an axis of symmetry, each of the at least four permanent magnet units comprises one or more permanent magnet pieces, each pieces being shaped in a rectangle in the section, the one or more permanent magnet pieces have the same magnetization direction for each permanent magnet unit, the magnetization direction being parallel or perpendicular to sides of the rectangle, and are arranged such that the magnetization direction of each of the at least four permanent magnet units in the section is line-symmetric with respect to the X-axis as the axis of symmetry, the at least four permanent magnet units comprise first, second, third and fourth permanent magnet units, and in the case where a positive direction of the X-axis, which is the same direction as the unidirectional magnetic field, is defined as 0° and 360°, and in a counterclockwise manner from the positive direction of the X-axis a positive direction of the Y-axis is defined as 90°, a negative direction of the X-axis is defined as 180°, and a negative direction of the Y-axis is defined as 270° in the section, (i) the first permanent magnet unit is disposed within ranges of 0° to 20° and 340° to 360°, the second permanent magnet unit is disposed within a range of 70° to 110°, the third permanent magnet unit is disposed within a range of 160° to 200°, and the fourth permanent magnet unit is disposed within a range of 250° to 290°, (ii) the one or more permanent magnet pieces comprised by each of the first and third permanent magnet units are five or more permanent magnet pieces linearly arranged in parallel to the Y-axis, the one or more permanent magnet pieces comprised by each of the second and fourth permanent magnet units are five or more permanent magnet pieces linearly arranged in parallel to the X-axis, and each of the one or more permanent magnet pieces comprised by each of the first to the fourth permanent magnet units has sides of the rectangle being parallel or perpendicular to the X-axis, (iii) the magnetization directions of the five or more permanent magnet pieces comprised by each of the first and third permanent magnet units are all the same as the magnetization direction of the unidirectional magnetic field, and the magnetization directions of the five or more permanent magnet pieces comprised by each of the second and fourth permanent magnet units are all opposite from the magnetization direction of the unidirectional magnetic field, and (iv) each of the first to the fourth permanent magnet units has a structure in which, with respect to the five or more permanent magnet pieces comprised by each of the permanent magnet units, permanent magnet pieces on both ends are more protruding toward the internal space than remaining permanent magnet pieces.

According to the present invention, the plurality of permanent magnet pieces having rectangular sections are combined and placed at predetermined positions to form a dipole ring magnetic field generator. This makes it possible to produce a dipole ring magnetic field generator at lower cost and to improve the directivity, i.e. to achieve a reduced skew angle, as compared with a conventional dipole ring magnetic field generator.

DETAILED DESCRIPTION OF THE PREFERRED EMBODIMENTS

Figure 1:
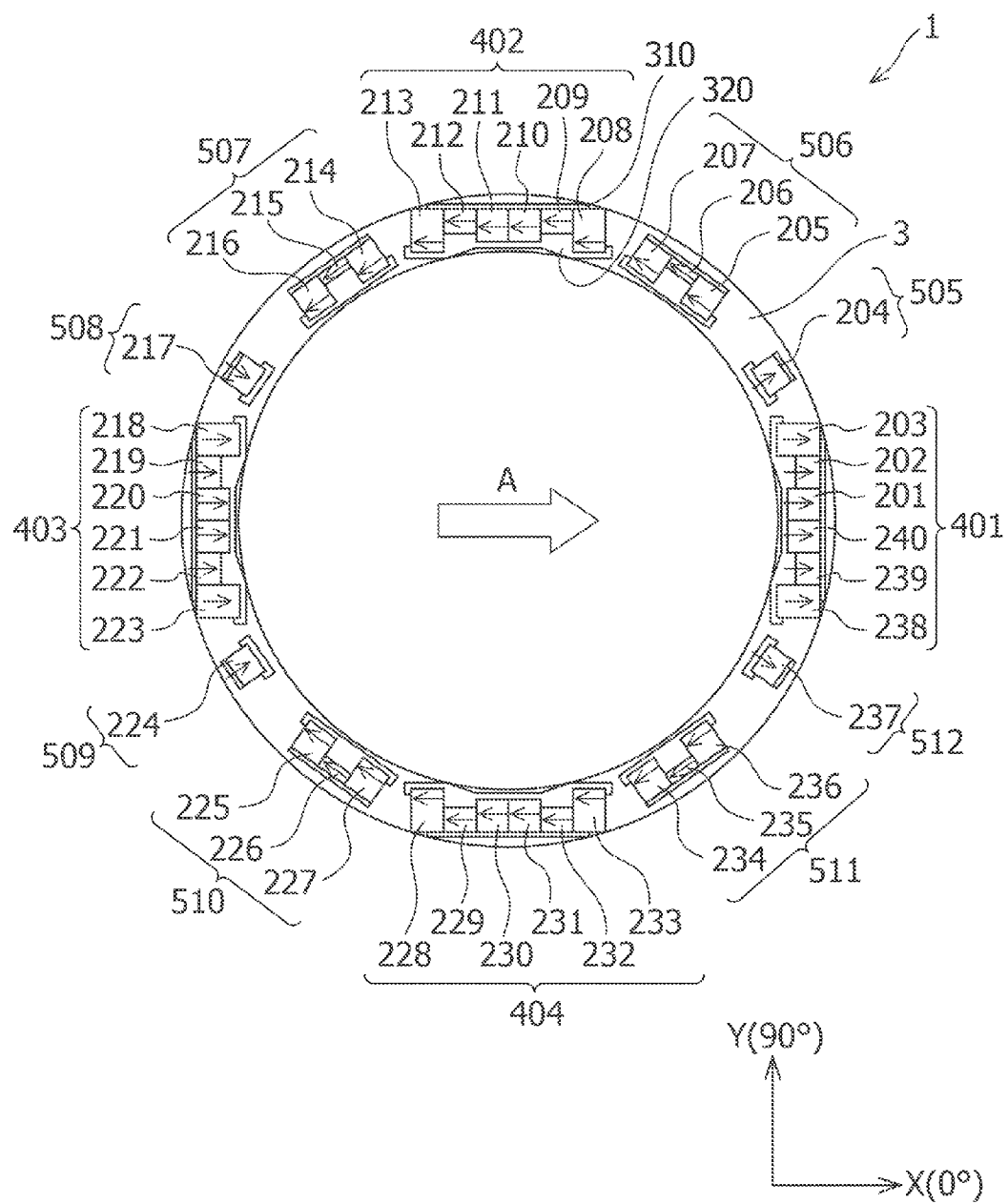
FIG. 1 exhibits a schematic sectional view of a dipole ring magnetic field generator (1) in accordance with the present invention in a plane perpendicular to the central axis of the generator (1), wherein an arrow "A" represents the direction of a main magnetic field component of a generated magnetic field, and the arrows on permanent magnet pieces (201 to 240) represent the magnetization directions of the permanent magnet pieces.

According to the present invention, a plurality of permanent magnet pieces having the rectangular sections in a plane perpendicular to the central axis of a dipole ring magnetic field generator (hereinafter may be referred to simply as "the sections") and having the magnetization directions parallel or perpendicular to the sides of the rectangular sections, are circularly arranged at positions within a predetermined range between the inner circumference and the outer circumference of a cylindrical yoke. All of the plurality of permanent magnet pieces used in the present invention preferably have rectangular sections. A dipole ring magnetic field generator capable of generating a unidirectional magnetic field, the generator comprising the permanent magnet pieces having rectangular sections and having the magnetization directions parallel or perpendicular to the sides of the rectangular sections, can be produced efficiently at lower cost, as compared with a conventional dipole ring magnetic field generator comprising permanent magnet pieces having fan-shaped or trapezoidal sections and having the magnetization directions defined according to the rules of the equations (1) and (2) described above.

In the dipole ring magnetic field generator in accordance with the present invention (hereinafter may be referred to simply as "the magnetic field generator"), a plurality of permanent magnet pieces having rectangular sections are required to be arranged at positions within a predetermined range in the magnetic field generator in order to generate a uniaxial magnetic field with high directivity and a reduced skew angle. The positions and the like of the permanent magnet pieces in a magnetic field generator in an embodiment of the present invention will be explained with reference to FIG. 1 and FIG. 2. The present invention, however, is not limited to the embodiment. The positions and the like of the permanent magnet pieces will be explained by defining the central axis of the magnetic field generator (i.e. the central axis of the yoke) as a Z-axis, defining an axis perpendicular to the Z-axis and parallel to a substantially unidirectional magnetic field generated in the internal space of the magnetic field generator (corresponding to the direction of an NS magnetic field, i.e. the direction "A" of the main magnetic field component) as an X-axis in the section of the magnetic field generator that is perpendicular to the central axis, and defining an axis perpendicular to the Z-axis and the X-axis (corresponding to the EW direction) as a Y-axis, as shown in FIGS. 1 and 2.

In order to generate a uniaxial magnetic field with high directivity, the positions of the permanent magnet pieces have to be precisely determined. Meanwhile, the permanent magnet pieces are placed symmetrically, so that once the positons of some permanent magnet pieces is determined, the positions of the other permanent magnet pieces will be unambiguously determined. The symmetry of the magnet positions significantly contributes to reducing a skew angle. More specifically, the permanent magnet pieces are placed so as to be symmetric with respect to the X-axis and the Y-axis in the section parallel to the plane (XY plane) which is perpendicular to the central axis of the magnetic field generator. For example, once the positions of the permanent magnet pieces are determined for only the part enclosed by the square dashed-line box shown in the right upper region of FIG. 2, the positions of the permanent magnet pieces in the remaining regions can be also determined.

Further, the permanent magnet pieces are preferably placed to be symmetric with respect to each criterion (at least one of the X-axis, the Y-axis and the Z-axis). In the section of the magnetic field generator, the placement symmetric with respect to each criterion includes, for example, (I) placement of the permanent magnet pieces of the same shape (dimension) at positions line-symmetric with respect to the X-axis in such a manner that magnetization directions thereof are the same for a direction parallel to the X-axis and are opposite for a direction parallel to the Y-axis, and (II) placement of the permanent magnet pieces of the same shape (dimension) at positions line-symmetric with respect to the Y-axis in such a manner that the magnetization directions thereof are the same for a direction parallel to the X-axis and are opposite for a direction parallel to the Y-axis. In other words, the permanent magnet pieces are placed such that the shapes (dimensions) in the section are line-symmetric to the X-axis as the axis of symmetry and also line-symmetric to the Y-axis as the axis of symmetry, and such that the magnetization directions in the section are line-symmetric to the X-axis as the axis of symmetry.

Figure 2A:
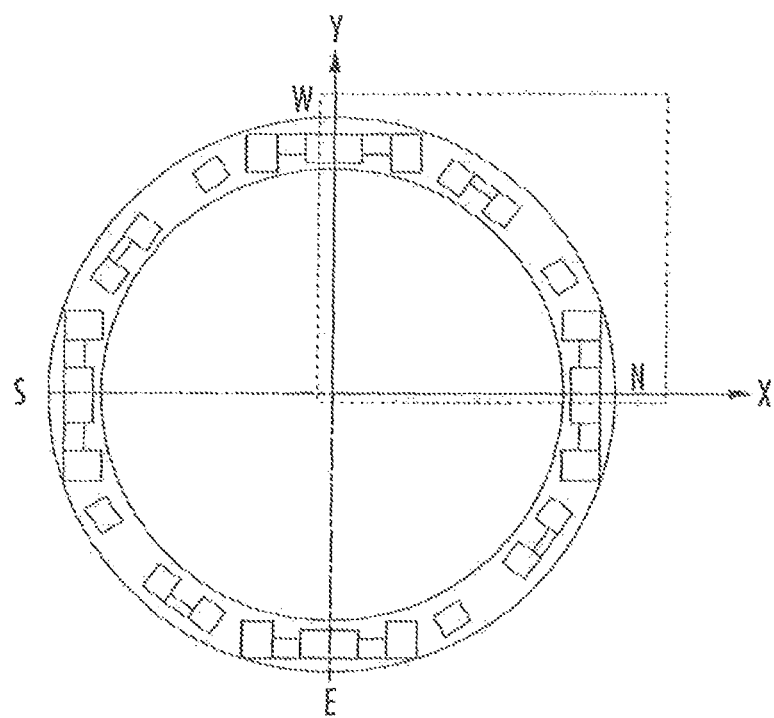
FIG. 2A exhibits a schematic sectional view of the dipole ring magnetic field generator in accordance with the present invention in a plane perpendicular to the central axis thereof, and FIG. 2B exhibits a schematic sectional view of the dipole ring magnetic field generator in accordance with the present invention in a plane passing through the central axis thereof.
Figure 2B:
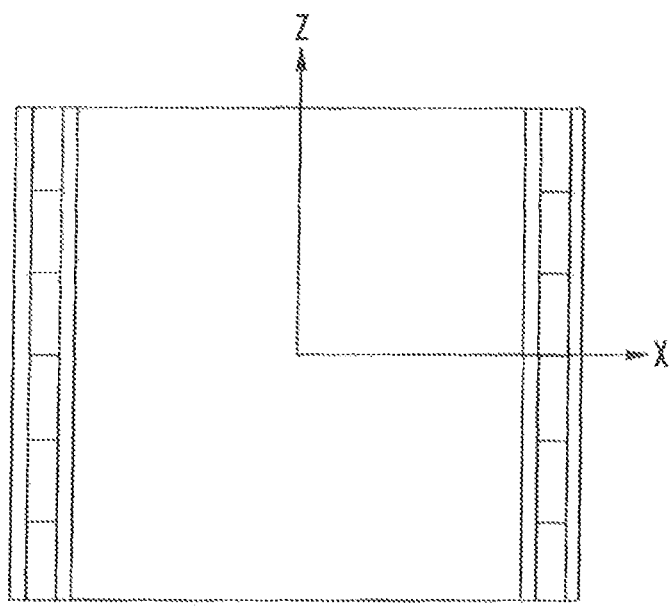

Approximate positions of the permanent magnet pieces in an embodiment are shown in FIG. 1 although the positions vary depending on the size of the magnetic field generator, a required intensity of magnetic field and a required level of magnetic field uniformity and the like. The magnetization directions of the permanent magnet pieces are preferably the radial direction or the circumferential direction (i.e. the tangential direction of the outer circumference of the cylindrical yoke) of the magnetic field generator as shown in FIG. 1. The magnetization directions of the permanent magnet pieces are the same for each permanent magnet unit, which will be discussed later. Further, as discussed later, the values corresponding to more specific position and dimensions of each magnet, the values corresponding to the magnitude and the magnetization direction of the magnetic field of each magnet, the number of the magnets to be used, etc. can be determined by, for example, optimization calculation.

Further, in an embodiment of the magnetic field generator, one or more permanent magnet pieces are appropriately combined to constitute a permanent magnet unit, and at least four such permanent magnet units are circularly arranged in the circumferential direction of the cylindrical yoke between the inner and outer circumferences of the yoke. The number of the permanent magnet units provided in the section of the magnetic field generator is preferably from 4 to 24, more preferably from 8 to 16, although the desirable number thereof varies depending on the size of the magnetic field generator, the required magnetic field intensity and magnetic field uniformity and the like. Further, the number of the permanent magnet pieces comprised by each of the permanent magnet units is preferably from 1 to 10, more preferably from 3 to 6 in the section. The total number of the permanent magnet pieces provided in the section of the magnetic field generator is preferably from 20 to 240, more preferably from 24 to 100. In the embodiment shown in FIG. 1, in the section, twelve permanent magnet units, which are main permanent magnet units 401 to 404 and auxiliary permanent magnet units 505 to 512, are circularly arranged in the circumferential direction between the inner and outer circumferences of the yoke, and each of the permanent magnet units comprises one to six permanent magnet pieces (201 to 240). The total number of the permanent magnet pieces in the section is forty. The permanent magnet units are preferably placed to be symmetric with respect to each criterion (at least one of the X-axis, the Y-axis and the Z-axis). The placement of the permanent magnet units symmetric to each criterion is the same as (I) and (II) in the case of the foregoing permanent magnet pieces. More specifically, as in the case of the foregoing permanent magnet pieces, in the section parallel to the plane (XY plane) which is perpendicular to the central axis of the magnetic field generator, the permanent magnet pieces are placed such that the shapes (dimensions) thereof are line-symmetric with respect to the X-axis as the axis of symmetry and also line-symmetric with respect to the Y-axis as the axis of symmetry, in such a manner that the magnetization directions thereof are line-symmetric with respect to the X-axis as the axis of symmetry. Further, the magnetization directions of the one or more permanent magnet pieces comprised by each permanent magnet unit are the same for each permanent magnet unit.

The magnetic field generator comprises at least four permanent magnet units (the first, second, third and fourth permanent magnet units 401 to 404), which are circularly arranged in the circumferential direction of the cylindrical yoke. The first, second, third and fourth permanent magnet units are indispensable permanent magnet units (the main permanent magnet units) comprised by the magnetic field generator, and have the following features (i) to (iv). The first, second, third and fourth permanent magnet units have magnetization directions parallel to the single radial direction of the magnetic field generated in the internal space, so that these permanent magnet units are indispensable for generating a uniaxial magnetic field with high directivity. Among them, the first and third permanent magnet units having the same magnetization directions as the direction of the unidirectional magnetic field are especially important.

(i) Positions of the First to Fourth Permanent Magnet Units

For example, with respect to the section parallel to the XY plane of a magnetic field generator 1 in FIG. 1, if a positive direction of the X-axis, which is the same direction as that of the unidirectional magnetic field generated inside the magnetic field generator, is defined as 0° and 360°, and in a counterclockwise manner from the positive direction from the X-axis, a positive direction of the Y-axis is defined as 90°, a negative direction of the X-axis is defined as 180°, and a negative direction of the Y-axis is defined as 270°, then the first permanent magnet unit (401) is disposed within ranges of 0° to 20° and 340° to 360°, the second permanent magnet unit (402) is disposed within a range of 70° to 110°, the third permanent magnet unit (403) is disposed within a range of 160° to 200°, and the fourth permanent magnet unit (404) is disposed within a range of 250° to 290°. In other words, the first permanent magnet unit (401) and the third permanent magnet unit (403) are disposed to be opposite from each other with respect to the central axis, and the second permanent magnet unit (402) and the fourth permanent magnet unit (404) are disposed to be opposite from each other with respect to the central axis. In this case, the phrase "disposed within a range (ranges)" of angles means that all the permanent magnet pieces comprised by each permanent magnet unit are placed at positions within the foregoing range of angles between the inner and outer circumferences of the yoke with respect to the section parallel to the XY plane of the magnetic field generator.

(ii) Magnet Pieces Comprised by the First to the Fourth Permanent Magnet Units

Each of the first and third permanent magnet units (401 and 403) comprises five or more, preferably five to ten permanent magnet pieces linearly arranged in parallel to the Y-axis. The directions in which the first and third permanent magnet units are arranged are perpendicular to the magnetization directions of the permanent magnet pieces comprised by the permanent magnet units. Further, the five or more permanent magnet pieces comprised by each of the first and third permanent magnet units are arranged such that each magnetization direction of the permanent magnet pieces is the same direction as that of the unidirectional magnetic field. On the other hand, each of the second and fourth permanent magnet units (402 and 404) comprises five or more, preferably five to ten permanent magnet pieces linearly arranged in parallel to the X-axis. The directions in which the second and fourth permanent magnet units are arranged are parallel to the magnetization directions of the permanent magnet pieces comprised by the permanent magnet units. Further, the permanent magnet pieces comprised by the second and fourth permanent magnet units are arranged such that each magnetization direction of the permanent magnet pieces is the opposite direction from that of the unidirectional magnetic field. Allowing each of the first to the fourth permanent magnet units, which are the main permanent magnet units, to comprise five or more magnets as described above, the intensity of the magnetic field generated in the internal space can be enhanced. A combination of the five or more permanent magnet pieces with adjusted dimensions makes it easier to adjust the skew angle than a single permanent magnet piece. In addition, there is no need to make a single rectangular magnet with an extremely high aspect ratio, which is advantageous in manufacture. In the embodiment shown in FIG. 1, the number of the magnet pieces comprised by each of the first to the fourth permanent magnet units is six. As described above, all of the one or more permanent magnet pieces comprised by each of the first to the fourth permanent magnet units have the rectangular sections, and are arranged such that each side of the rectangles is parallel or perpendicular to the X-axis.

(iii) Magnetization Directions of the First to the Fourth Permanent Magnet Units The five or more permanent magnet pieces comprised by each of the first and third permanent magnet units (401 and 403) are placed such that all the magnetization directions thereof are the same as that of the unidirectional magnetic field generated in the internal space of the magnetic field generator, that is, the positive direction of the X-axis. Further, the five or more permanent magnet pieces comprised by each of the second and fourth permanent magnet units (402 and 404) are arranged such that all the magnetization directions thereof are opposite from the magnetization direction of the unidirectional magnetic field generated in the internal space of the magnetic field generator, that is, the negative direction of the X-axis. Regarding the first to the fourth permanent magnet units, adjoining permanent magnet units (e.g. the first permanent magnet unit and the second permanent magnet unit) are placed such that the magnetization directions thereof are different from each other by 180°.

(iv) Shapes of the First to the Fourth Permanent Magnet Units

Each of the first, second, third and fourth permanent magnet units (401, 402, 403 and 404) has a structure in which, with respect to the five or more permanent magnet pieces comprised by each of the permanent magnet units, the permanent magnet pieces on both ends are more protruding toward the internal space than remaining permanent magnet pieces. In other words, a pair of permanent magnet units which are disposed on the X-axis or the Y-axis and positioned on the opposite sides from each other with respect to the central axis, more specifically, a pair of the first third permanent magnet units or a pair of the second and fourth permanent magnet units, may have hollow shapes facing each other. Alternatively, such a pair of permanent magnet units may have E-shapes facing each other. The E-shape has a structure in which, with respect to the five or more permanent magnet pieces comprised by each of the permanent magnet units, at least one permanent magnet piece at a center is more protruding toward the internal space than the permanent magnet pieces other than the permanent magnet pieces on both ends and at a center, but less protruding than the permanent magnet pieces on both ends. The at least one permanent magnet piece at a center is preferably one permanent magnet piece when the five or more permanent magnet pieces are present in an odd number, while preferably two permanent magnet pieces when the five or more permanent magnet pieces are present in an even number. In the embodiment shown in FIG. 1, the first to fourth permanent magnet units have the E-shapes. Configuring each of the first, second, third and fourth permanent magnet units in the hollow shape or the E-shape to allow both ends thereof to be protruding toward the inside diameter, makes it possible to ensure the unidirectivity of a magnetic flux and to achieve a reduced skew angle. The permanent magnet pieces on both ends and at a center are protruding only inward in the radial direction of the magnetic field generator but not protruding outward in the radial direction. This means that the first to fourth permanent magnet units are flat on the outer side in the radial direction and are unevenly shaped only on the inner side in the radial direction. This is because adjusting the shapes of the permanent magnet units on the internal space side, where a magnetic field is generated, exerts more influences on a change in the magnetic field.

There are no particular restrictions on how much protruding the permanent magnet pieces on both ends are in each of the first, second, third and fourth permanent magnet units. With respect to the five or more permanent magnet pieces comprised by each of the first and third permanent magnet units, each side parallel to the X-axis of the permanent magnet pieces on both ends has a length of preferably 101% to 150%, more preferably 110% to 140%, of the average length (100%) of each side parallel to the X-axis of the five or more permanent magnet pieces comprised by each of the first and third permanent magnet units. Further, with respect to the five or more permanent magnet pieces comprised by each of the second and fourth permanent magnet units, each side parallel to the Y-axis of permanent magnet pieces on both ends has a length of preferably 101% to 150%, preferably 110% to 140%, of the average length (100%) of each side parallel to the Y-axis of the five or more permanent magnet pieces comprised by each of the second and fourth permanent magnet units. The average length of each side parallel to the X-axis or the Y-axis in this case is intended to mean the average length of the sides parallel to the X-axis or the Y-axis regarding all the five or more permanent magnet pieces (including the permanent magnet pieces on both ends) comprised by each of the permanent magnet units.

Further, in the case of the E-shaped permanent magnet unit, the at least one permanent magnet piece at a center among the five or more permanent magnet pieces is less protruding toward the internal space than the permanent magnet pieces on both ends, but more protruding toward the internal space than the permanent magnet pieces other than permanent magnet pieces at a center and on both ends. More specifically, with respect to the five or more permanent magnet pieces comprised by each of the first and third permanent magnet units, each side parallel to the X-axis of the at least one permanent magnet piece at a center has a length of preferably 80% to 140%, more preferably 90% to 130%, of the average length (100%) of each side parallel to the X-axis of the five or more permanent magnet pieces comprised by each of the first and third permanent magnet units. Further, with respect to the five or more permanent magnet pieces comprised by each of the second and fourth permanent magnet units, each side parallel to the Y-axis of the at least one permanent magnet piece at a center has a length of preferably 80% to 140%, more preferably 90% to 130%, of the average length (100%) of each side parallel to the Y-axis of the five or more permanent magnet pieces comprised by each of the second and fourth permanent magnet units. The average length of each side parallel to the X-axis or the Y-axis in this case is the average length of the sides parallel to the X-axis or the Y-axis regarding all the five or more permanent magnet pieces (including the permanent magnet pieces on both ends and at a center) comprised by each of the permanent magnet units. Since the average length is calculated by inclusion of the lengths of the permanent magnet pieces on both ends, which are more protruding than the at least one permanent magnet piece at a center, the length of the at least one permanent magnet piece at a center may be shorter than the average length of all the five or more permanent magnet pieces.

Further, the first, second, third or fourth permanent magnet unit is not limited to the hollow shape having the permanent magnet pieces protruding only on both ends, or the E-shape having the permanent magnet pieces protruding on both ends and at a center, and may have a shape having more hollows or protrusions. The number of the hollows or protrusions may be adjusted appropriately in order to reduce the skew angle. Even when a shape having more hollows or protrusions is used, the shape of allowing the permanent magnet pieces on both ends to be most protruding inward in the radial direction among all the permanent magnet pieces is preferred from the standpoint of reducing the skew angle.

In order to reduce the skew angle and improve the intensity of the magnetic field, auxiliary permanent magnet units are preferably placed in addition to the main permanent magnet units of the first, second, third and fourth permanent magnet units. The auxiliary permanent magnet units are appropriately placed among the first, second, third and fourth permanent magnet units so as to achieve a desired low skew angle. More specifically, one to four auxiliary permanent magnet units, preferably two or three auxiliary permanent magnet units, are preferably placed in each interval between the main permanent magnet units in the circumferential direction of the section. The total number of the auxiliary permanent magnet units in the entire section of the magnetic field generator may be appropriately adjusted in consideration of a desired intensity of the magnetic field or a desired reduction in the skew angle. The total number of the auxiliary permanent magnet units is preferably from 4 to 16, more preferably from 8 to 12. Each of the auxiliary permanent magnet units comprises one or more permanent magnet pieces. The number of the permanent magnet pieces is preferably 1 to 5, more preferably 1 to 3. The auxiliary permanent magnet units are placed to make fine adjustment of the skew angle or the intensity of the magnetic field, so that each of the auxiliary permanent magnet units does not have to comprise a plurality of permanent magnet pieces. For example, each of the auxiliary permanent magnet units may comprise one permanent magnet piece. On the other hand, the first to fourth main permanent magnet units are closely related to the reduction in the skew angle or the intensity of the magnetic field to be generated because of the positions thereof, so that the first to fourth main permanent magnet units preferably comprise a larger number of permanent magnet pieces than the auxiliary permanent magnet units (e.g. the fifth to the twelfth permanent magnet units). Preferably, the auxiliary permanent magnet units are also arranged such that the shapes (dimensions) thereof in the section are line-symmetric to the X-axis as the axis of symmetry and also line-symmetric to the Y-axis as the axis of symmetry, and such that the magnetization directions thereof in the section are line-symmetric to the X-axis as the axis of symmetry.

In the embodiment of FIG. 1, eight auxiliary permanent magnet units (the fifth to twelfth permanent magnet units 505 to 512) are disposed in addition to the four main permanent magnet units (the first, second, third and fourth permanent magnet units 401 to 404). Two of the fifth to the twelfth auxiliary permanent magnet units are placed in each interval between the main permanent magnet units in the circumferential direction of the section. Each of the auxiliary permanent magnet units comprises one or three permanent magnet pieces and appropriately placed at a position that allows a desired low skew angle to be achieved. More specifically, in the embodiment of FIG. 1, the fifth permanent magnet unit is placed in the range of 25° to 35°, the sixth permanent magnet unit is placed in the range of 45° to 65°, the seventh permanent magnet unit is placed in the range of 115° to 135°, the eighth permanent magnet unit is placed in the range of 145° to 155°, the ninth permanent magnet unit is placed in the range of 205° to 215°, the tenth permanent magnet unit is placed in the range of 225° to 245°, the eleventh permanent magnet unit is placed in the range of 295° to 315°, and the twelfth permanent magnet unit is placed in the range of 325° to 335°. However, the placement of the permanent magnet units is not limited thereto. In order to reduce the skew angle, each of the fifth, eighth, ninth and twelfth auxiliary permanent magnet units comprises one permanent magnet piece, and is placed on each side of the first and third main permanent magnet units, while each of the sixth, seventh, tenth and eleventh auxiliary permanent magnet units comprises three permanent magnet pieces, and is placed on each side of the second and fourth main permanent magnet units. The positions of the auxiliary permanent magnet units and the number of the permanent magnet pieces comprised by the auxiliary permanent magnet units are appropriately selected according to the shape and the size of the internal space in which the skew angle is to be reduced.

The auxiliary permanent magnet units are magnetized in the radial direction or the circumferential direction (i.e. the tangential direction of the outer circumference of the yoke) of the magnetic field generator. More specifically, the auxiliary permanent magnet units (the fifth and twelfth auxiliary permanent magnet units) positioned on both sides of the first main permanent magnet unit having the same magnetization direction as that of the unidirectional magnetic field generated in the internal space are magnetized in the radial outward direction. The auxiliary permanent magnet units (the sixth and seventh auxiliary permanent magnet units) positioned on both sides of the second main permanent magnet unit having the opposite magnetization direction from that of the unidirectional magnetic field generated in the internal space are magnetized in the opposite tangential direction from the direction of the unidirectional magnetic field. The auxiliary permanent magnet units (the eighth and ninth auxiliary permanent magnet units) positioned on both sides of the third main permanent magnet unit having the same magnetization direction as that of the unidirectional magnetic field generated in the internal space are magnetized in the radial inward direction toward the internal space. The auxiliary permanent magnet units (the tenth and eleventh auxiliary permanent magnet units) positioned on both sides of the fourth main permanent magnet unit having the opposite magnetization direction from that of the unidirectional magnetic field generated in the internal space are magnetized in the opposite tangential direction from the direction of the unidirectional magnetic field. One or more permanent magnet pieces comprised by each auxiliary permanent magnet unit are also magnetized in the same direction for each auxiliary permanent magnet unit.

The dimensions and positions of the permanent magnet pieces, and the sizes and the magnetization directions and the like of the magnetic fields of the permanent magnet pieces can be determined in more detail by using various types of mathematical programming methods, such as the quasi-Newton's method or a search method. For example, optimization calculation can be used to determine the longitudinal and lateral dimensions and the thickness of each permanent magnet piece shaped like a rectangular parallelepiped or cube, and the position of each permanent magnet piece. The optimization technique to be used for the optimization calculation can include various types of mathematical programming methods, among which a nonlinear programming method, such as the quasi-Newton's method or the search method, is preferably used. Two or more of the optimization technique can be combined to avoid a localized optimum solution or to shorten calculation time. The factor of the optimization calculation may be the skew angle, $\tan^{-1}(B_y/B_x)$, in the internal space of the magnetic field generator, and design variables can be determined to obtain a minimum value of the skew angle. Herein, $B_x$ and $B_y$ represent the X-axis direction magnetic field component (main magnetic field component) and the Y-axis direction magnetic field component (skew angle component), respectively, with respect to the magnetic field created by the magnetic field generator. The design variables are 1) magnet dimensions which are (longitudinal dimension: magnetization direction) times (lateral dimension: non-magnetization direction) times (thickness: height in the Z-axis direction), and 2) magnet position which is determined by a radius from the central axis of the magnetic field generator and angle from the direction, defined as zero degrees, of magnetic field generated in the internal space. The design variables can be determined for each permanent magnet piece. Connecting a plurality of permanent magnet pieces makes it easier to produce the magnetic field generator, so that the number of a magnet unit having three or more permanent magnet pieces connected is preferably increased. However, a magnet unit comprising one permanent magnet piece or a magnet unit comprising two permanent magnet pieces connected may be also used if it can reduce a skew angle. The magnetic field generator may further comprise optional one or more permanent magnet pieces or optional one or more permanent magnet units, such as permanent magnet pieces or permanent magnet units which are not symmetric with respect to the X-axis or Y-axis, insofar as they do not affect the reduction in the skew angle.

The permanent magnet pieces to be used for the magnetic field generator may include rare earth permanent magnets of Nd—Fe—B base, Sm—Co base, Sm—N—Fe base or the like, which are the same as those in a conventional dipole ring magnetic field generator. More specifically, Nd—Fe—B base magnets, which are relatively inexpensive and have high energy products, are preferably used, but the permanent magnet pieces are not limited thereto.

As described above, the whole permanent magnet piece is shaped like a rectangular parallelepiped or cube (prismatic). In other words, the sectional shape of each of the permanent magnet pieces (the shape shown in FIGS. 1 to 3) in the plane perpendicular to the central axis of the magnetic field generator is rectangular. The term "rectangular" may be oblong or square. Preferably, all the permanent magnet pieces to be comprised by the magnetic field generator have the rectangular sections. The size of each of the permanent magnet pieces is such that each side of the rectangular section thereof is preferably 50 mm or less, more preferably from 5 mm to 40 mm, further more preferably from 5 mm to 30 mm in the plane perpendicular to the central axis of the magnetic field generator. Combination of two or more permanent magnet pieces having rectangular sections of said dimensions makes it possible to form a permanent magnet unit having a desired size and shape. The aspect ratio of a long side length to a short side length of the rectangular section of each permanent magnet piece may be individually adjusted appropriately, while maintaining a desired reduction in the skew angle. The ratio of the long side length to the short side length of the rectangle is preferably 1:1 to 8:1 from the standpoint of production and the like, and more preferably 1.1:1 to 4:1 in consideration of easy distinguishability of magnetization directions.

The length of each permanent magnet piece in the axial direction is preferably 50 mm or less, more preferably 5 mm to 45 mm in the same manner as the above. A plurality of permanent magnet pieces having such lengths may be arranged in the axial direction, so that for example, the permanent magnet pieces can be extended from one end to the other end (from one opening to the other opening) in the axial direction of the magnetic field generator. From the standpoint of production, all the lengths of the permanent magnet pieces in the axial direction are preferably the same. For example, in an embodiment shown in FIG. 2B, six permanent magnet pieces having the same sectional shapes and the same lengths in the axial direction are arranged in the axial direction from one opening to the other opening of the magnetic field generator. It is not necessary to place the permanent magnet pieces from one end to the other end of the magnetic field generator, and the permanent magnet pieces may be placed in the axial direction only in a part required to generate a magnetic field in the internal space. The specific dimensions of the permanent magnet pieces may be appropriately adjusted within the foregoing ranges according to a required intensity of a magnetic field, the inside and outside of diameters of the magnetic field generator or the like. All the permanent magnet pieces are placed to be fitted between the inner and outer circumferences of the yoke, i.e. accommodated in the yoke. Further, the magnetization direction of each permanent magnet piece is parallel or perpendicular to each side of the rectangular section. This makes it possible to easily process the permanent magnet pieces, thus permitting reduced processing cost.

The cylindrical yoke in which the permanent magnet pieces are disposed may be made of a nonmagnetic material. The nonmagnetic material may include, but not limited to, aluminum, and stainless steel (SUS). The use of the nonmagnetic material for the yoke makes it possible to maintain the directivity of the magnetic field based on the placement of the permanent magnet pieces described above. The yoke has a cylindrical shape. The inside and outside diameters of the cylindrical yoke can be determined according to a required intensity of magnetic field, the relationship with a device installed inside or outside of the magnetic field generator, or the like. For instance, the inside diameter of the yoke is selected to allow a device, which uses the magnetic field generated in the internal space, to be inserted therein. The yoke has at least four magnet insertion holes (at least the same number as the number of the permanent magnet units in the section), which are circularly provided between the inner and outer circumferences of the yoke in the circumferential direction and in parallel to the central axis of the yoke. Preferably, the magnet insertion holes are formed as through holes passing from one end having one opening to the other end having the other opening. Alternatively, the magnet insertion holes may be formed to pass only one end of the yoke and not to pass the other end insofar as the permanent magnet pieces can be inserted therein. Further alternatively, the magnet insertion holes may be formed to pass none of the ends (formed as holes present inside the yoke). In the present specification, the central axis of the magnetic field generator and the central axis of the yoke refer to the same axis. Further, the central point of the magnetic field generator and the central point of the yoke refer to the same point, which is on the central axis of the magnetic field generator and the yoke and is regarded as the midpoint in the direction of the central axis.

The magnetic field generator can be produced by inserting one or more permanent magnet pieces comprised by each permanent magnet unit into each magnet insertion hole of the yoke and fixing the inserted permanent magnet pieces to the yoke. The permanent magnet pieces can be inserted into the yoke according to a conventional method by using, for example, an assembly jig. One or more permanent magnet pieces may be combined to prepare each permanent magnet unit in advance and then the permanent magnet unit may be inserted into the magnet insertion hole of the magnetic field generator. The permanent magnet pieces can be bonded using, for example, a publicly known adhesive. There are no particular restrictions on the method for fixing the inserted permanent magnet pieces or permanent magnet units to the yoke. For example, an adhesive or bolts may be used for fixing.

For example, as shown in FIG. 1, a plurality of permanent magnet pieces comprised by the same permanent magnet unit are bonded to a single nonmagnetic plate called a back plate 310 to make the permanent magnet unit to be inserted. In this case, the back plate 310 is placed on the outside diameter side of the plurality of permanent magnet pieces. The permanent magnet units to be inserted are magnetized, and then inserted into the magnet insertion holes of the yoke. For example, a guide rail is attached to the yoke, and the units are inserted into the magnet insertion holes along the guide rail. Optionally, each unit can be pushed by a jack bolt or the like connected with the yoke via the guide rail so as to place the unit at a predetermined position in the hole. If a unit is divided in the axial direction, then the same operation is performed for the number of the divisions. Threaded screw holes can be provided in advance in the back plate that can match the magnet insertion holes provided in the yoke, so that the back plate will be fixed to the yoke by screws, thereby fixing the unit at a predetermined position. Further, as represented by 320 in FIG. 1, a cover can be further provided on the inside diameter side of the plurality of permanent magnet pieces comprised by the same permanent magnet unit. In the case where the inside diameter of the yoke 3 has to be increased or magnets in the assembly process have to be protected, the magnets can be protected by providing the cover 320 to prevent the inside diameter side of the magnets from being exposed. The cover is required to be nonmagnetic, as with the back plate. The material for the back plate and the cover may include an aluminum alloy, nonmagnetic stainless, brass and a resin. A plurality of permanent magnet pieces can be bonded to make a permanent magnet unit, and one or both of the back plate and cover are bonded thereto before magnetization, and then magnetized and inserted into the yoke 3. The size of the magnet insertion holes in the yoke may be appropriately adjusted according to the presence or absence of the back plate or the cover in the permanent magnet unit to be inserted.

The magnetic field generator comprises the cylindrical yoke and the plurality of permanent magnet pieces circularly arranged inside of the yoke, i.e. between the inner and outer circumferences of the yoke, in the circumferential direction, as described above. The intensity of a magnetic field can be increased by increasing the occupation ratio of the permanent magnet pieces with respect to the yoke according to a desired intensity of the magnetic field. For example, the area occupied by the rectangular magnet pieces in the section of the yoke having specified inside and outside diameters can be increased by increasing the number of the permanent magnet units and/or the number of the permanent magnet pieces in the section. To further increase the intensity of the magnetic field, increasing the lengths in the axial direction of the permanent magnet units and/or the permanent magnet pieces is also effective.

With the arrangement described above, a substantially unidirectional magnetic field can be generated in the internal space of the ring of the magnetic field generator by using only the permanent magnet pieces having rectangular sections. In the magnetic field generator according to the present invention, the skew angle can be reduced throughout the internal space. The skew angle at a randomly selected location in the internal space of the ring of the magnetic field generator can be determined as indicated below.

Skew angle [deg]=$\tan^{-1}(B_y/B_x)$, wherein $B_x$ represents the X-axis direction magnetic field component of main magnetic field, and $B_y$ represents the Y-axis direction magnetic field component of by-product magnetic field.

Each magnetic field component can be measured using a Teslameter which uses a Hall element. In the case of a single-axis Hall element, the X and Y components can be measured by performing the measurement twice by shifting the direction by 90 degrees. Recently, a measurement device comprising a plurality of elements is available, which is capable of simultaneously measuring three components, namely, X, Y and Z components, by a single probe.

The skew angle (deg) at a randomly selected location in the internal space of the magnetic field generator falls preferably within the range of −2° to 2°, more preferably within the range of −1° to 1°. It is not necessary that the skew angle be small and fall within the foregoing range at every location in the internal space of the magnetic field generator. The skew angle is required to fall within the foregoing range at a randomly selected position at least in the space near the center of the internal space. More specifically, the space near the center means, for example, a cylindrical space being defined in the internal space and having the same central axis and the same central point as those of the cylindrical yoke, which is the cylindrical space having a diameter of 50% or less of the full inside diameter of the yoke and a length in the axial direction of 20% or less of the full length of the yoke in the axial direction. In other words, the maximum skew angle [deg] in the defined cylindrical space preferably falls within the foregoing ranges. The skew angle tends to increase toward the inner wall, i.e. toward the outside diameter side of the internal space, of the magnetic field generator and decrease toward the center of the internal space owing to the characteristics of the magnetic field generator. Therefore, if the skew angle measured in the internal space on the outside diameter side beyond the cylindrical space defined above falls within the foregoing preferable range, then it can be said that the skew angle at a randomly selected position in the cylindrical space defined above also falls within the foregoing preferable ranges.

According to the present invention, the magnetic field generator is a dipole ring magnetic field generator having the permanent magnet pieces circularly placed and being capable of generating a substantially unidirectional magnetic field in the internal space of the ring, so that the magnetic field generator is suited for an extensive range of applications, as with a conventional dipole ring magnetic field generator. According to the present invention, the magnetic field generator can be used as, for example, a magnetic resonance imager (MRI); a plasma treatment apparatus configured to carry out a predetermined treatment on the surface of a substrate, such as a semiconductor waver used in a semiconductor device manufacturing process; and a uniform magnetic field generating means for basic researches. Further, the features that enable low-cost manufacture and smaller skew angles make the magnetic field generator suited especially for highly accurate plasma control or magnetic film orientation.

EXAMPLES

Example 1

Figure 3:
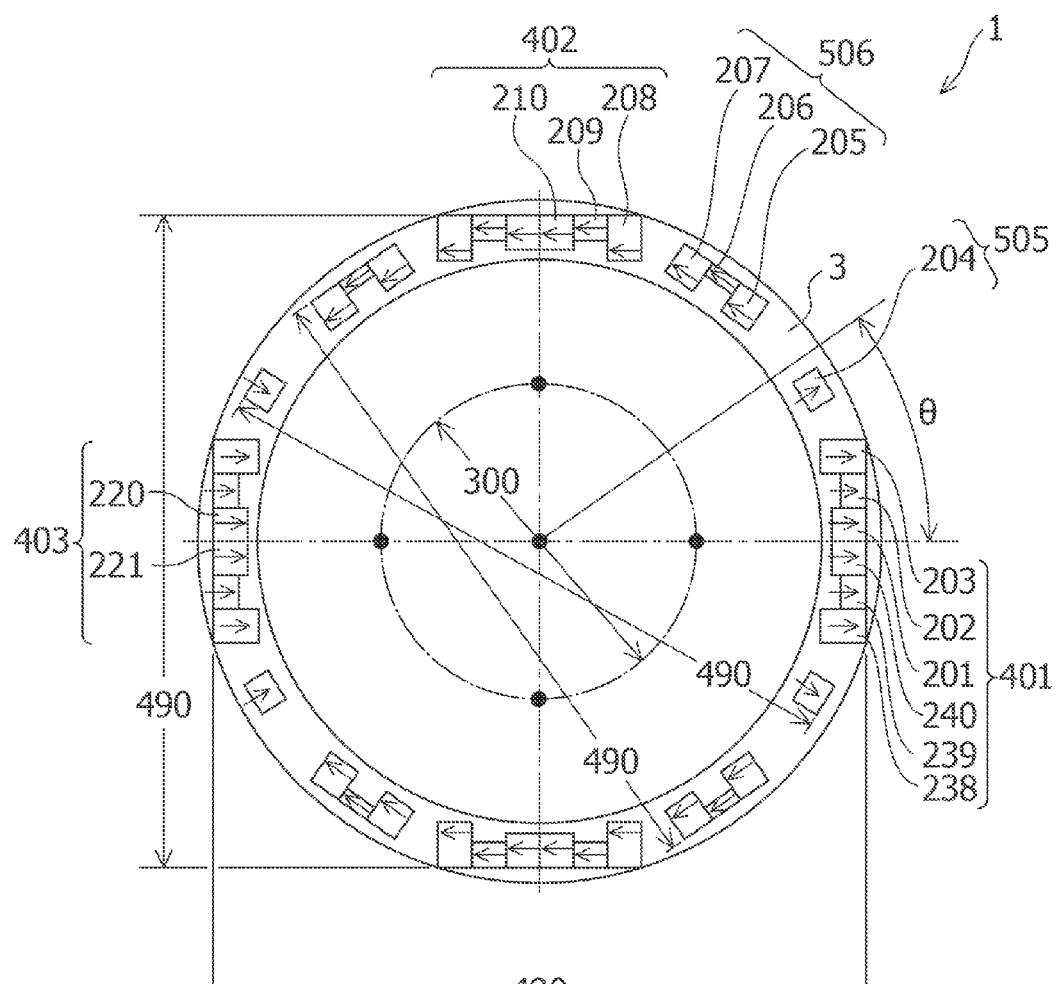
FIG. 3 exhibits a schematic sectional view of a dipole ring magnetic field generator in an embodiment of the present invention in a plane perpendicular to the central axis of the dipole ring magnetic field generator.
Figure 3:
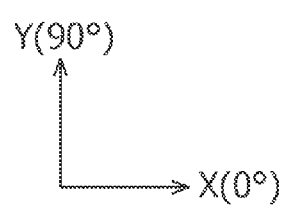

In Example 1, a dipole ring magnetic field generator shown in FIG. 3 was fabricated. FIG. 3 exhibits a schematic sectional view of the dipole ring magnetic field generator in a plane being perpendicular to the central axis and passing through the central point of the magnetic field generator. A neodymium base sintered rare earth magnet (N45 by Shin-Etsu Chemical Co. Ltd., the magnetic force of 1.28 T) having a rectangular section (the whole shape being a rectangular parallelepiped) was used. A nonmagnetic material (stainless steel, SUS304) was used for the yoke. The yoke was cylindrical, and had an outside diameter of 500 mm, an inside diameter of 430 mm, and a depth (the length in the axial direction) of 648 mm. As shown in FIG. 3, the distance between a pair of permanent magnet units positioned on the opposite sides with respect to the central axis, which was the shortest distance from the side on the outside diameter side of one permanent magnet unit to the side on the outside diameter side of the other permanent magnet unit, was 490 mm. The permanent magnet pieces were bonded to make each permanent magnet unit, and then each unit was magnetized and inserted into a magnet insertion hole of the yoke. As a result, the permanent magnet pieces comprised by the permanent magnet units were incorporated into the yoke for assembling of the actual magnetic field generator. The magnet layout in FIG. 3 is the same as the magnet layout in FIG. 1, so that some reference numerals are omitted in FIG. 3.

Regarding the magnet pieces (201 to 210) placed in the positive direction of the X-axis and the positive direction of the Y-axis among forty permanent magnet pieces 201 to 240 comprised by the magnetic field generator in FIG. 3, the longitudinal dimension and the lateral dimension of each magnet piece are listed in Table 1 below. The longitudinal dimension is the dimension in the direction parallel to the magnetization direction of each magnet piece, while the lateral dimension is the dimension in the direction perpendicular to the magnetization direction of each magnet piece. The thickness of each magnet piece, which was the length in the direction of the depth of the magnetic field generator, was fixed to 36 mm. Eighteen magnet pieces were placed in the direction of the depth to match the depth (648 mm) of the magnetic field generator. The magnetization directions of the magnet pieces were parallel or perpendicular to each side of each magnet piece, and are shown by the arrows drawn on magnet pieces in FIG. 3. The magnet pieces were placed symmetrically with respect to the X-axis and the Y-axis, so that the forty magnet pieces (201 to 240) were circularly arranged as a whole as shown in FIG. 3.

As shown in FIG. 3, the forty permanent magnet pieces 201 to 240 are used individually or combined by three or six into first to twelfth permanent magnet units, which are first to fourth main permanent magnet units 401 to 404 and fifth to twelfth auxiliary permanent magnet units 505 to 512; and placed in the yoke 3, more specifically, between the inner and outer circumferences of the yoke 3. The permanent magnet pieces were placed such that the first permanent magnet unit (401) falls within the range of 0° to 20° and the range of 340° to 360°, the second permanent magnet unit (402) falls within the range of 70° to 110°, the third permanent magnet unit (403) falls within the range of 160° to 200°, and the fourth permanent magnet unit (404) falls within the range of 250° to 290°. Herein, the positive direction of the X-axis, which is the same direction as that of a unidirectional magnetic field generated in the magnetic field generator, is defined by 0° and 360°, and as counterclockwise angles θ, the positive direction of the Y-axis is defined by 90°, the negative direction of the X-axis is defined by 180°, and the negative direction of the Y-axis is defined by 270°. Further, each of the first and third permanent magnet units comprises six permanent magnet pieces linearly arranged in parallel to the Y-axis, while each of the second and fourth permanent magnet units comprises six permanent magnet pieces linearly arranged in parallel to the X-axis. The magnetization directions of the permanent magnet pieces comprised by the first and third permanent magnet units were all the same as the direction of the unidirectional magnetic field generated in the internal space, while the magnetization directions of the permanent magnet pieces comprised by the second and fourth permanent magnet units were all opposite from the direction of the unidirectional magnetic field generated in the internal space. Each of the first, second, third and fourth permanent magnet units has a structure in which, with respect to the six permanent magnet pieces comprised by each of the permanent magnet units, two permanent magnet pieces on both ends are more protruding toward the internal space than the other permanent magnet pieces. In addition, two magnet pieces at a center are more protruding toward the internal space than the other magnet pieces except those on both ends. Thus, the two magnet pieces at a center are less protruding than the magnet pieces on both ends. More specifically, regarding the first permanent magnet unit 401 comprising the magnet pieces 201, 202, 203, 238, 239 and 240, the magnet pieces 203 and 238 positioned on both ends have a longitudinal length (in the magnetization direction, which is the X-axis direction in this case) of 35 mm, the magnet pieces 202 and 239 positioned adjacently thereto have a longitudinal length (in the magnetization direction, which is the X-axis direction in this case) of 14 mm, and the magnet pieces 201 and 240 positioned at the center have a longitudinal length (in the magnetization direction, which is the X-axis direction in this case) of 26 mm (see Table 1). Thus, the first permanent magnet unit 401 is configured to have an E-shape in which protrusions are present toward the internal space at the ends and at a center thereof. The same applies to the second, third and fourth permanent magnet units 402, 403 and 404.

Further, the fifth to twelfth permanent magnet units 505 to 512 were placed at the positions shown in FIG. 3. Since some reference numerals are omitted in FIG. 3, FIG. 1 should be also referred to with respect to the reference numerals of the permanent magnet units. Specifically, the fifth and twelfth permanent magnet units (505 and 512) comprising respective one permanent magnet piece, were placed on both sides in the circumferential direction of the first permanent magnet unit 401. The sixth and seventh permanent magnet units (506 and 507) comprising respective three permanent magnet pieces, were placed on both sides in the circumferential direction of the second permanent magnet unit 402. The eighth and ninth permanent magnet units (508 and 509) comprising respective one permanent magnet piece, were placed on both sides in the circumferential direction of the third permanent magnet unit 403. The tenth and eleventh permanent magnet units (510 and 511) comprising respective three permanent magnet pieces, were placed on both sides in the circumferential direction of the fourth permanent magnet unit 404. Specifically, the permanent magnet units were placed between the inner and outer circumferences of the yoke 3 such that the fifth permanent magnet unit (505) fell within the range of 25° to 35°, the sixth permanent magnet unit (506) fell within the range of 45° to 65°, the seventh permanent magnet unit (507) fell within the range of 115° to 135°, the eighth permanent magnet unit (508) fell within the range of 145° to 155°, the ninth permanent magnet unit (509) fell within the range of 205° to 215°, the tenth permanent magnet unit (510) fell within the range of 225° to 245°, the eleventh permanent magnet unit (511) fell within the range of 295° to 315°, and the twelfth permanent magnet unit (512) fell within the range of 325° to 335°

The detailed dimensions and position of each of the permanent magnet pieces (201 to 240) were determined by optimization calculation. A search method was used for the optimization, and the skew angles at four evaluation points shown in FIG. 3 were adopted as the optimization factors. The four evaluation points are represented by the four black dots on the circumference having a diameter of 300 mm, the circumference being indicated by the dot-and-dash line in FIG. 3. The obtained evaluation results of the maximum skew angles (deg) in the magnetic field generator of Example 1 are listed in Table 1. The maximum skew angle (deg) is the highest value of the four evaluation points. The method for measuring the skew angle (deg) at each evaluation point is as described above. The maximum skew angle in the magnetic field generator of Example 1 was as small as 0.9°. Thus, it has been confirmed that a substantially unidirectional magnetic field can be generated by using only the magnet pieces having rectangular sections.

TABLE 1

| Magnet No. | Longitudinal (mm) | Lateral (mm) |
| --- | --- | --- |
| 201 | 26 | 26 |
| 202 | 14 | 26 |
| 203 | 35 | 26 |
| 204 | 22 | 26 |
| 205 | 26 | 26 |
| 206 | 26 | 4 |
| 207 | 26 | 26 |

TABLE 1-continued

| Magnet No. | Longitudinal (mm) | Lateral (mm) |
|---|---|---|
| 208 | 26 | 35 |
| 209 | 26 | 21 |
| 210 | 26 | 26 |
| Max. skew angle (deg) | | 0.9 |

Comparative Example 1

Figure 4:
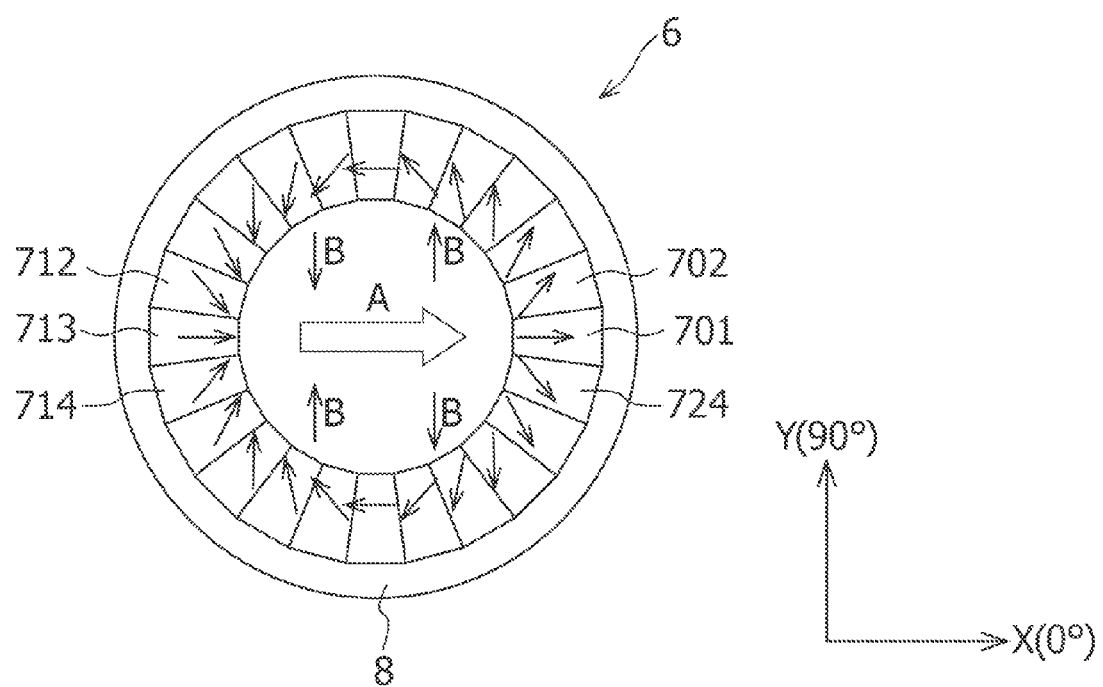
FIG. 4 exhibits a schematic sectional view of a conventional dipole ring magnetic field generator in a plane perpendicular to the central axis thereof, wherein an arrow "A" represents the direction of a main magnetic field component of a generated magnetic field, an arrow "B" represents the direction of a skew angle component, and the arrows on permanent magnet pieces (701 to 724) represent the magnetization directions of the permanent magnet pieces.

For the purpose of comparison, a conventional dipole ring magnetic field generator shown in FIG. 4, which has the same performance as that of the dipole ring magnetic field generator of Example 1, was fabricated. The conventional dipole ring magnetic field generator 6 in FIG. 4 comprises twenty-four magnet pieces 701 to 724, which are of approximately trapezoidal and circularly placed. The outer circumferences of the magnet pieces are surrounded by an annular outer rim yoke 8. In this comparative example, the magnet pieces 701 to 724 are individually magnetized in the directions given by equations (1) and (2) described above, and the magnet pieces on opposite sides from each other with respect to the central axis are magnetized with an angle difference of 180 degrees. With this configuration, a substantially unidirectional magnetic field is generated in the internal space of the ring of the dipole ring magnetic field generator 6. The outside diameter of the dipole ring magnetic field generator 6, including the outer rim yoke 8, was 700 mm, the inside diameter thereof (i.e. the diameter of the internal space formed by the magnet pieces 601 to 624) was 600 mm, and the depth in the direction of the central axis of the magnetic field generator was 620 mm. A neodymium base sintered rare earth magnet (N45 by Shin-Etsu Chemical Co., Ltd. having the magnetic force of 1.28 T) was used for the approximately trapezoidal magnet pieces 701 to 724. A nonmagnetic material (stainless steel, SUS304) was used for the outer rim yoke 8. The obtained maximum skew angle (deg) in the magnetic field generator of Comparative Example 1 was 0.9°

Thus, the maximum skew angle in the dipole ring magnetic field generator of Example 1 in accordance with the present invention was 0.9°, which is the same as the maximum skew angle 0.9° in the conventional dipole ring magnetic field generator of Comparative Example 1. In other words, it was possible to achieve such a small skew angle as that in the conventional dipole ring magnetic field generator by using only the magnets having rectangular sections and placing the magnets at predetermined positions rather than using trapezoidal magnets, which are difficult and costly to manufacture.

<Cost Comparison>

The cost comparison was made between the dipole ring magnetic field generator of Example 1 according to the present invention and the conventional dipole ring magnetic field generator of Comparative Example 1. The results are shown in Table 2. The cost was calculated on basis of production of one hundred generators and on the assumption that the production cost per unit time (i.e. work unit price) was the same. The cost of the magnetic field generator of the Example 1 was shown in percentage relatively to the cost of the magnetic field generator of the Comparative Example 1, which was defined as 100%. In Table 2, the row of "Magnet" indicates the comparison in the cost of materials and machining (or purchase price if purchased) required to make the magnets having the rectangular sections in Example 1 versus the magnets having the trapezoidal sections in Comparative Example 1. The row of "Yoke" indicates the comparison in the cost of materials and machining (or purchased price if purchased) required to make each yoke. The row of "Assembly cost" indicates the comparison in the labor cost required for assembling the magnetic field generator. The row of "Miscellaneous" indicates the comparison in the cost of auxiliary materials such as guiderails, jack bolts and adhesives, other than the magnets and the yokes. The row of "Price of product" indicates the comparison in the estimated price of a completed product. It is evident from the comparison results that the dipole ring magnetic field generator of Example 1 according to the present invention is capable of achieving a significant reduction in cost, such as 50% reduction in the price of a completed product, as compared with the conventional dipole ring magnetic field generator of Comparative Example 1. Particularly with respect to "Magnet", it has been revealed that the permanent magnet pieces having the rectangular sections as in Example 1 can significantly reduce the quantities of materials and the cost required for machining, as compared with the case where the permanent magnet pieces having the trapezoidal sections are used as in Comparative Example 1.

TABLE 2

| Item | Comparative Example 1 | Example 1 |
|---|---|---|
| Magnet | 100 | 8 |
| Yoke | 100 | 90 |
| Assembly cost | 100 | 33 |
| Miscellaneous | 100 | 75 |
| Price of Product | 100 | 50 |

Thus, a plurality of permanent magnet pieces having the rectangular sections at predetermined positions can reduce the manufacturing cost in comparison with a conventional dipole ring magnetic field generator, and also bring a desired small skew angle.

The invention claimed is:

1. A dipole ring magnetic field generator comprising:
a cylindrical yoke in which at least four magnet insertion holes are circularly provided in a circumferential direction between an inner circumference and an outer circumference of the cylindrical yoke, each direction of depth of the magnet insertion holes being parallel to a central axis of the cylindrical yoke; and
at least four permanent magnet units inserted in the at least four magnet insertion holes,
the dipole ring magnetic field generator being adapted to generate a substantially unidirectional magnetic field in a radial direction of the cylindrical yoke in an internal space of the cylindrical yoke,
wherein, in the case where the central axis is defined as a Z-axis, an axis perpendicular to the Z-axis and parallel to the unidirectional magnetic field in a section perpendicular to the central axis is defined as an X-axis, and an axis perpendicular to the Z-axis and the X-axis is defined as a Y-axis,
the at least four permanent magnet units are arranged such that shapes thereof in the section are line-symmetric with respect to the X-axis as an axis of symmetry and line-symmetric with respect to the Y-axis as an axis of symmetry,
each of the at least four permanent magnet units comprises one or more permanent magnet pieces, each of the pieces being shaped in a rectangle in the section,
the one or more permanent magnet pieces have the same magnetization direction for each permanent magnet unit, the magnetization direction being parallel or perpendicular to sides of the rectangle, and are arranged such that the magnetization direction of each of the at least four permanent magnet units in the section is line-symmetric with respect to the X-axis as the axis of symmetry, the at least four permanent magnet units comprise first, second, third and fourth permanent magnet units, and in the case where a positive direction of the X-axis, which is the same direction as the unidirectional magnetic field, is defined as 0° and 360°, and in a counterclockwise manner from the positive direction of the X-axis, a positive direction of the Y-axis is defined as 90°, a negative direction of the X-axis is defined as 180°, and a negative direction of the Y-axis is defined as 270° in the section, (i) the first permanent magnet unit is disposed within ranges of 0° to 20° and 340° to 360°, the second permanent magnet unit is disposed within a range of 70° to 110°, the third permanent magnet unit is disposed within a range of 160° to 200°, and the fourth permanent magnet unit is disposed within a range of 250° to 290°, (ii) the one or more permanent magnet pieces comprised by each of the first and third permanent magnet units are five or more permanent magnet pieces linearly arranged in parallel to the Y-axis, the one or more permanent magnet pieces comprised by each of the second and fourth permanent magnet units are five or more permanent magnet pieces linearly arranged in parallel to the X-axis, and each of the one or more permanent magnet pieces comprised by each of the first to fourth permanent magnet units has sides of the rectangle being parallel or perpendicular to the X-axis, (iii) the magnetization directions of the five or more permanent magnet pieces comprised by each of the first and third permanent magnet units are all the same as the magnetization direction of the unidirectional magnetic field, and the magnetization directions of the five or more permanent magnet pieces comprised by each of the second and fourth permanent magnet units are all opposite from the magnetization direction of the unidirectional magnetic field, and (iv) each of the first to fourth permanent magnet units has a structure in which, with respect to the five or more permanent magnet pieces comprised by each of the permanent magnet units, permanent magnet pieces on both ends are more protruding toward the internal space than remaining permanent magnet pieces.

2. The magnetic field generator according to claim 1, wherein with respect to the five or more permanent magnet pieces comprised by each of the first and third permanent magnet units, each side parallel to the X-axis of the permanent magnet pieces on both ends has a length of 101% to 150% of an average length of each side parallel to the X-axis of the five or more permanent magnet pieces comprised by each of the first and third permanent magnet units, while with respect to the five or more permanent magnet pieces comprised by each of the second and fourth permanent magnet units, each side parallel to the Y-axis of the permanent magnet pieces on both ends has a length of 101% to 150% of an average length of each side parallel to the Y-axis of the five or more permanent magnet pieces comprised by each of the second and fourth permanent magnet units.

3. The magnetic field generator according to claim 1, wherein with respect to the five or more permanent magnet pieces comprised by each of the first to fourth permanent magnet units, at least one permanent magnet piece at a center is less protruding toward the internal space than the permanent magnet pieces on both ends but more protruding toward the internal space than permanent magnet pieces other than the permanent magnet pieces at a center and on both ends.

4. The magnetic field generator according to claim 3, wherein with respect to the five or more permanent magnet pieces comprised by each of the first and third permanent magnet units, each side parallel to the X-axis of the at least one permanent magnet piece at a center has a length of 80% to 140% of an average length of each side parallel to the X-axis of the five or more permanent magnet pieces comprised by each of the first and third permanent magnet units, while with respect to the five or more permanent magnet pieces comprised by each of the second and fourth permanent magnet units, each side parallel to the Y-axis of the at least one permanent magnet piece at a center has a length of 80% to 140% of an average length of each side parallel to the Y-axis of the five or more permanent magnet pieces comprised by each of the second and fourth permanent magnet units.

5. The magnetic field generator according to claim 1, wherein the at least four permanent magnet units further comprise fifth to twelfth permanent magnet units, two each of which are placed in each interval between the first to fourth permanent magnet units in the circumferential direction.

6. The magnetic field generator according to claim 1, wherein, in the case where $B_x$ and $B_y$ represent an X-axis direction magnetic field component and a Y-axis direction magnetic field component of a magnetic field generated at any position in a cylindrical space which is defined in the internal space, respectively, has the same central axis and the same central point as those of the cylindrical yoke, and has a diameter of 50% or less of an inside diameter of the yoke and a length in an axial direction of 20% or less of a length of the yoke in the axial direction, a skew angle expressed by $\tan^{-1}(B_y/B_x)$ is 2° or less.

7. The magnetic field generator according to claim 1, wherein the yoke comprises a nonmagnetic material.

8. The magnetic field generator according to claim 2, wherein with respect to the five or more permanent magnet pieces comprised by each of the first to fourth permanent magnet units, at least one permanent magnet piece at a center is less protruding toward the internal space than the permanent magnet pieces on both ends but more protruding toward the internal space than permanent magnet pieces other than the permanent magnet pieces at a center and on both ends.

9. The magnetic field generator according to claim 8, wherein with respect to the five or more permanent magnet pieces comprised by each of the first and third permanent magnet units, each side parallel to the X-axis of the at least one permanent magnet piece at a center has a length of 80% to 140% of an average length of each side parallel to the X-axis of the five or more permanent magnet pieces comprised by each of the first and third permanent magnet units, while with respect to the five or more permanent magnet pieces comprised by each of the second and fourth permanent magnet units, each side parallel to the Y-axis of the at least one permanent magnet piece at a center has a length of 80% to 140% of an average length of each side parallel to the Y-axis of the five or more permanent magnet pieces comprised by each of the second and fourth permanent magnet units.

10. The magnetic field generator according to claim 2, wherein the at least four permanent magnet units further comprise fifth to twelfth permanent magnet units, two each of which are placed in each interval between the first to fourth permanent magnet units in the circumferential direction.

11. The magnetic field generator according to claim 2, wherein, in the case where $B_x$ and $B_y$ represent an X-axis direction magnetic field component and a Y-axis direction magnetic field component of a magnetic field generated at any position in a cylindrical space which is defined in the internal space, respectively, has the same central axis and the same central point as those of the cylindrical yoke, and has a diameter of 50% or less of an inside diameter of the yoke and a length in an axial direction of 20% or less of a length of the yoke in the axial direction, a skew angle expressed by $\tan^{-1}(B_y/B_x)$ is 2° or less.

12. The magnetic field generator according to claim 2, wherein the yoke comprises a nonmagnetic material.

13. The magnetic field generator according to claim 3, wherein, in the case where $B_x$ and $B_y$ represent an X-axis direction magnetic field component and a Y-axis direction magnetic field component of a magnetic field generated at any position in a cylindrical space which is defined in the internal space, respectively, has the same central axis and the same central point as those of the cylindrical yoke, and has a diameter of 50% or less of an inside diameter of the yoke and a length in an axial direction of 20% or less of a length of the yoke in the axial direction, a skew angle expressed by $\tan^{-1}(B_y/B_x)$ is 2° or less.

14. The magnetic field generator according to claim 3, wherein the yoke comprises a nonmagnetic material.

* * * * *